(12) United States Patent
Radosavljevic et al.

(10) Patent No.: US 10,840,341 B2
(45) Date of Patent: Nov. 17, 2020

(54) SEMICONDUCTOR DEVICES, RADIO FREQUENCY DEVICES AND METHODS FOR FORMING SEMICONDUCTOR DEVICES

(71) Applicant: INTEL Corporation, Santa Clara, CA (US)

(72) Inventors: Marko Radosavljevic, Portland, OR (US); Han Wui Then, Portland, OR (US); Sansaptak Dasgupta, Hillsboro, OR (US); Paul B. Fischer, Portland, OR (US); Walid M. Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 16/168,873

(22) Filed: Oct. 24, 2018

(65) Prior Publication Data
US 2020/0135865 A1 Apr. 30, 2020

(51) Int. Cl.
| H01L 29/66 | (2006.01) |
| H01L 29/20 | (2006.01) |
| H01L 29/417 | (2006.01) |
| H01L 29/08 | (2006.01) |
| H01L 21/28 | (2006.01) |
| H03F 3/193 | (2006.01) |
| H01L 29/778 | (2006.01) |

(52) U.S. Cl.
CPC .... *H01L 29/2003* (2013.01); *H01L 21/28158* (2013.01); *H01L 29/0847* (2013.01); *H01L 29/41725* (2013.01); *H01L 29/66462* (2013.01); *H01L 29/778* (2013.01); *H03F 3/193* (2013.01); *H03F 2200/451* (2013.01)

(58) Field of Classification Search
CPC .......... H01L 29/2003; H01L 29/41725; H01L 29/0847; H01L 21/28158; H01L 29/66462; H01L 29/778; H01L 29/4236; H01L 29/0895; H01L 29/7786; H03F 3/193; H03F 2200/451
See application file for complete search history.

(56) References Cited

U.S. PATENT DOCUMENTS

2018/0175184 A1* 6/2018 Then ................. H01L 29/78

* cited by examiner

*Primary Examiner* — Robert G Bachner
(74) *Attorney, Agent, or Firm* — 2SPL Patent Attorneys PartG mbB

(57) ABSTRACT

A semiconductor device is proposed. The semiconductor device includes a group III-N semiconductor layer, an electrically insulating material layer located on the group III-N semiconductor layer, and a metal contact structure located on the electrically insulating material layer. An electrical resistance between the metal contact structure and the group III-N semiconductor layer through the electrically insulating material layer is smaller than $1*10^{-7}\Omega$ for an area of 1 mm$^2$. Further, semiconductor devices including a low resistance contact structure, radio frequency devices, and methods for forming semiconductor devices are proposed.

25 Claims, 8 Drawing Sheets

SEMICONDUCTOR DEVICES, RADIO FREQUENCY DEVICES AND METHODS FOR FORMING SEMICONDUCTOR DEVICES

FIELD

Examples of the present disclosure relate to semiconductor devices and to group III-N semiconductor devices in particular. Further examples relate to radio frequency devices including group III-N semiconductor structures, to methods for forming semiconductor devices, and to communication systems.

BACKGROUND

In modern radio technologies, there is a need for fast and efficient transistors for enabling improved functionality of communication systems, for example. Therefore, new semiconductor materials as for example wide band gap semiconductor materials are researched for radio applications. For example, group III-N semiconductors or III-N technology may be relevant for enabling new communication standards like the 5G standard.

One aspect for enabling the application of wide band gap semiconductor devices is e.g. defining low resistance contacts to the wide band gap semiconductor material, for example GaN material, which may be challenging in part due to its large bandgap. Low resistance contacts are needed to fulfill the potential for high performance transistors needed in the field of radio frequency (RF) applications, for example.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element (e.g. first layer) is referred to as being "located on" or "formed on" another element (e.g. second layer), the elements may be in contact with each other or one or more intervening elements (e.g. third layer) may be located in between. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
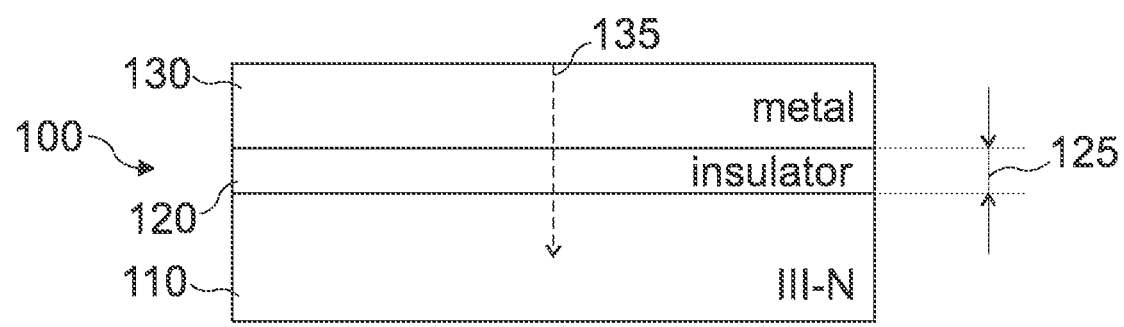
FIG. 1 shows a schematic cross section of a part of a semiconductor device with an electrically insulating material layer between a metal contact structure and a group III-N semiconductor layer.

FIG. 1 shows an example of a semiconductor device 100 with an electrically insulating material layer between a metal contact structure and a group III-N semiconductor layer. Accordingly, the semiconductor device 100 comprises a group III-N semiconductor layer 110 and an electrically insulating material layer 120 formed on the group III-N semiconductor layer 110. Further, the semiconductor device 100 comprises a metal contact structure 130 formed on the electrically insulating material layer 120.

The semiconductor device 100 may be configured to conduct an electrical current 135 from the metal contact structure 130 to the group III-N semiconductor layer 110 through the electrically insulating material layer 120. The metal contact structure 130, the electrically insulating material layer 120 and the group III-N semiconductor layer 110 may form a low resistive contact structure. For example, an ohmic contact may exist between the metal contact structure 130 and the group III-N semiconductor layer 110 through the electrically insulating material layer 120. For example, although the electrically insulating material layer 120 may comprise electrically insulating material, the electrically insulating material layer 120 does not electrically insulate the metal contact structure 130 from the group III-N semiconductor layer 110 (e.g. due to the small thickness of the layer). In contrast, an electrical resistance between the metal contact structure 130 and the group III-N semiconductor layer 110 may be lowered due to introducing the intermediary electrically insulating material layer 120, e.g. compared to a contact structure comprising an electrically conductive layer deposited directly on a group III-N semiconductor layer.

An electrical resistance between the metal contact structure 130 and the group III-N semiconductor layer 110 through the electrically insulating material layer 120 may be smaller than $1*10^{-6} \Omega$ (or smaller than $1*10^{-7} \Omega$, smaller than $1*10^{-8} \Omega$ or smaller than $1*10^{-9} \Omega$) for an area of 1 mm². In other words, the electrical resistance between the metal contact structure 130 and the group III-N semiconductor layer 110 may be smaller than $1*10^{-6}$ $\Omega$mm² (or smaller than $1 e^{-7}$ $\Omega$mm², smaller than $1*10^{-8} \Omega$ or smaller than $1*10^{-9} \Omega$). For example, "$\Omega$ for an area of 1 mm²" is used as unit for the electrical resistance, although the actual contact area of the metal contact structure is much smaller. Alternatively, $\Omega \mu m^2$ (e.g. $1*10^{-6}$ $\Omega$mm²=1 $\Omega \mu m^2$) or $\Omega$ nm² (e.g. $1*10^{-6}$ $\Omega$mm²=$1*10^6$ $\Omega$nm²) may be used as units. The absolute electrical resistance between the metal contact structure 130 and the group III-N semiconductor layer 110 through the electrically insulating material layer 120 may depend on the size of the contact area between the metal contact structure 130 and the group III-N semiconductor layer 110. For example, the contact area between the metal contact structure 130 and the group III-N semiconductor layer 110 may be equal to an area of the electrically insulating material layer 120 used to conduct current between the metal contact structure 130 and the group III-N semiconductor layer 110 and/or an area of the electrically insulating material layer 120 in contact with the metal contact structure 130 at one side and in contact with the group III-N semiconductor layer 110 and/or a highly doped group III-N contact portion. For example, the contact area between the metal contact structure 130 and the group III-N semiconductor layer 110 may be smaller than 1 $\mu m^2$ (or smaller than 0.1 $\mu m^2$ or smaller than 1000 nm²). The electrical resistance may be measured by only taking into account an electrical path leading through the electrically insulating material layer 120. For example, the metal contact structure 130 may have an contact area of 0.01 $\mu m^2$, hence the actual electrical resistance of the semiconductor device 100 may be smaller than $1*10^{-7}$ $\Omega$mm²*$(0.01\ \mu m^2)^{-1}$=10$\Omega$ or smaller than $1*10^{-8}$ $\Omega$mm²*$(0.01\ \mu m^2)^{-1}$=1$\Omega$.

The low electrical resistance of the proposed group III-N semiconductor to metal contact may be achieved due to providing an insulator between the metal contact structure and the semiconductor material, e.g. the electrically insulating material layer 120, which, for example, allows unpinning of the Fermi level, and providing a lower Schottky barrier for electron injection into the III-N material, e.g. the group III-N semiconductor layer 110. An effect of the proposed concept may be the ability to tune a band alignment of metal to III-N material semiconductor, depending on dielectric film, e.g. the electrically insulating material layer 120, that is inserted in between. An ohmic characteristic of the group III-N semiconductor to metal contact may be achieved due to thermionic emission over the barrier introduced by the electrically insulating material layer 120 and/or tunneling through the electrically insulating material layer 120, for example.

The electrically insulating material layer 120 may be in contact with the group III-N semiconductor layer 110, and/or the metal contact structure 130 may be in contact with the electrically insulating material layer 120, for example. The group III-N semiconductor layer 110, the electrically insulating material layer 120, and the metal contact structure 130 may be vertically stacked. For example, the vertical direction and a vertical dimension may be measured orthogonal to a backside surface of a semiconductor substrate (e.g. the group III-N semiconductor layer 110 or a substrate on which the group III-N semiconductor layer 110 is located) of the semiconductor device 100.

For example, a thickness 125 of the electrically insulating material layer 120 may be at least 0.1 nm (or at least 0.2 nm, at least 0.3 nm, at least 0.5 nm or at least 1 nm) and/or at most 5 nm (or at most 3 nm, at most 2 nm or at most 1 nm). The thickness 125 of the electrically insulating material layer 120 may be small so that an insulating effect of the electrically insulating material layer is smaller than a reduction of the electrical resistance due to introducing the electrically insulating material layer 120 for avoiding direct contact of the metal contact structure 130 with the group III-N semiconductor layer 110, for example.

For example, the electrically insulating material layer 120 may be an oxide layer or a nitride layer. The electrically insulating material layer 120 may be a titanium dioxide (TiO2) layer, a hafnium dioxide (HfO2) layer, an aluminum oxide (Al2O3) layer, or a zirconium dioxide (ZrO2) layer or a combination of two or more of these materials. The electrically insulating material layer 120 may comprises at least 90% (or more than 95% or more than 99%) of the respective oxide material, for example. A remaining percentage of material differing from the respective oxide material may result from impurities, for example.

For example, the group III-N semiconductor layer 110 may be a gallium nitride (GaN) layer or an indium gallium nitride (InGaN) layer. A thickness and/or vertical dimension of the group III-N semiconductor layer 110 may be at least 100 nm (or at least 200 nm, at least 500 nm or at least 1 $\mu$m) and/or at most 8 $\mu$m (or at most 5 $\mu$m, at most 3 $\mu$m or at most 1 $\mu$m).

For example, the insulating material used for the electrically insulating material layer 120 may be selected to be similar to the semiconductor material used for the group III-N semiconductor layer 110 with respect to the band gap of the materials. For example, the group III-N semiconductor layer 110 may comprise GaN with a band gap of 3.4 eV and the electrically insulating material layer 120 may comprise TiO2 with a band gap of 3.5 eV. Similar band gaps of the materials of the two layers may improve the conductivity of the semiconductor device 100, to for example further reduce the electrical resistance between the metal contact structure 130 and the group III-N semiconductor layer 110.

According to an example, the semiconductor device 100 may comprise a highly doped group III-N contact portion located between the electrically insulating material layer 120 and a portion of the group III-N semiconductor layer. For example, the highly doped group III-N contact portion may be in contact with the electrically insulating material layer 120. In other words, a contact interface may exist between a bottom surface of the electrically insulating material layer 120 and a top surface of the highly doped group III-N contact portion, for example. The highly doped group III-N contact portion may be part, e.g. a doped portion, of the group III-N semiconductor layer 110 or may be a semiconductor portion located, e.g. epitaxially grown, on the group III-N semiconductor layer 110.

A vertical dimension of the highly doped group III-N contact portion may be at least 20 nm (or at least 50 nm or at least 100 nm) and/or at most 250 nm (or at most 200 nm or at most 150 nm). For example, the highly doped group III-N contact portion may be in contact with the electrically insulating material layer 120 in the same or partially same area as the metal contact structure 130.

Figure 3:
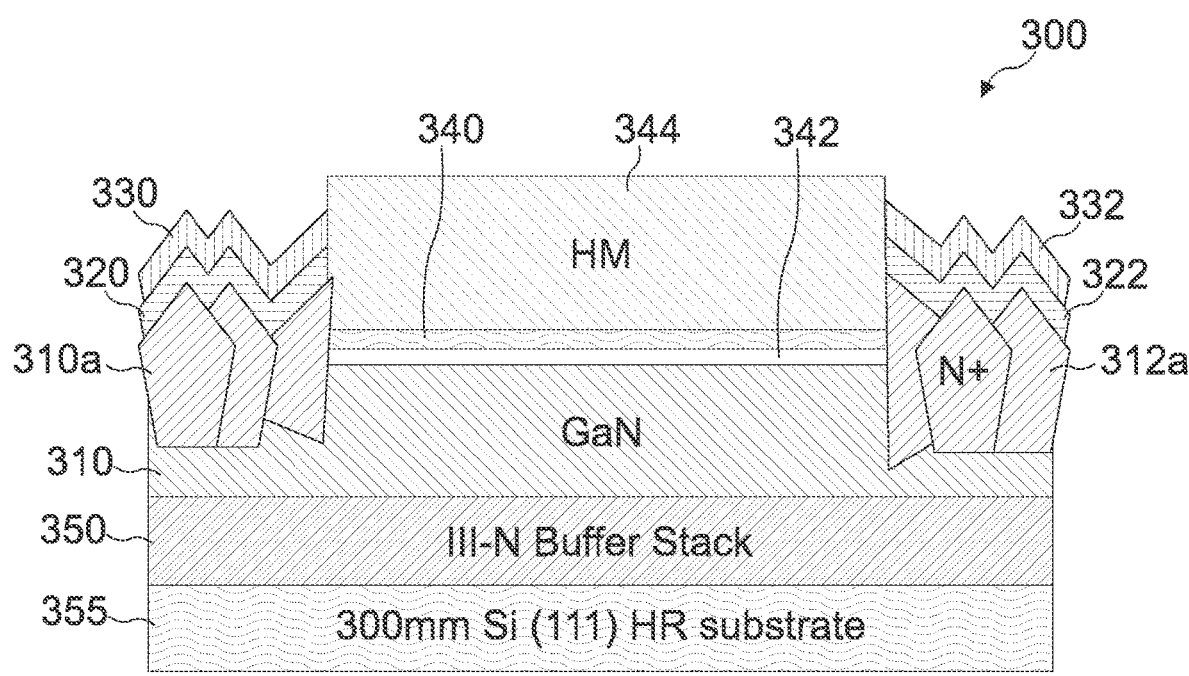
FIG. 3 shows a schematic cross section of a part of a semiconductor device comprising a field effect transistor.

For example, the group III-N semiconductor layer 110 may be formed on a group III-N buffer layer (e.g. shown in FIG. 3). The group III-N semiconductor layer 110 may be deposited or epitaxially grown on the group III-N buffer layer. The group III-N buffer layer may have a thickness of at least 100 nm (or at least 200 nm, at least 500 nm or at least 1 µm) and/or at most 8 µm (or at most 5 µm, at most 3 µm or at most 2 µm). For example, the group III-N semiconductor layer 110 may comprise a semiconductor material differing from a semiconductor material of the group III-N buffer layer or may comprise the same semiconductor material.

For example, the metal contact structure 130 may comprise a metal layer or a metal portion comprising at least one of copper, tungsten and aluminum and/or an alloy of copper, tungsten and/or aluminum, for example. For example, the metal layer or a metal portion of the metal contact structure 130 may comprise more than 90% of copper, tungsten and/or aluminum. The metal portion may have a vertical extension or height of at least 30 nm (or at least 50 nm) and/or of at most 250 nm (or at most 150 nm).

Additionally, the metal contact structure 130 may comprise a sublayer being an adhesion layer, a work function layer and/or a barrier layer for improving the adhesion, the adaption of the work function and/or the barrier for diffusion. The sublayer of the metal contact structure 130 may be a titanium (Ti) layer, a titanium nitride (TiN) layer, or a tantalum nitride (TaN) layer. The adhesion layer may have a thickness of at least 1 nm (or at least 2 nm or at least 5 nm) and/or of at most 20 nm (or at most 15 nm, at most 10 nm or at most 5 nm).

Further, the metal contact structure 130 may comprise a second sublayer, e.g. a metal portion located on the adhesion layer and in contact with the adhesion layer. The metal portion may For example, the group III-N semiconductor layer 110 may be located or formed on a silicon substrate (e.g. a (111) crystal structure substrate and/or a high-resistivity (HR) substrate). The group III-N semiconductor layer 110 may be in contact with the silicon substrate. Alternatively, e.g. if the semiconductor device 100 comprises a buffer layer, the group III-N semiconductor layer 110 may be in contact with the group III-N buffer layer, and the group III-N buffer layer may be in contact with the silicon substrate.

For example, the semiconductor device 100 may comprise a transistor, e.g. a field effect transistor, and the metal contact structure 130 may provide an electrical contact to a semiconductor region of the transistor. The field effect transistor may be a lateral transistor, e.g. a high-electron-mobility transistor (HEMT) or a metal oxide semiconductor field effect transistor (MOSFET).

For example, the metal contact structure 130 may be a source contact of a field effect transistor of the semiconductor device. The semiconductor device 100 may comprise a further metal contact structure, e.g. providing a drain contact of the field effect transistor. Accordingly, the semiconductor device 100 may be configured to conduct a current between the metal contact structure 130 and the further metal contact structure along a current path through the electrically insulating material layer 120 and the group III-N semiconductor layer 110. The current path from the channel region of the field effect transistor to the further metal contact structure may lead through a further electrically insulating material layer. For example, the further metal contact structure may be located on the further electrically insulating material layer.

The field effect transistor may be a high-electron-mobility transistor and e.g. further comprise a polarization layer located on the group III-N semiconductor layer and positioned laterally between the source contact and the drain contact of the field effect transistor. The polarization layer and the group III-N semiconductor layer 110 may form a heterostructure of the semiconductor device 100. The polarization layer may be an aluminum gallium nitride layer, an indium aluminum nitride layer, or an indium aluminum gallium nitride layer, for example. The polarization layer and the group III-N semiconductor layer comprise different semiconductor materials, having different band gaps, for example. The polarization layer may have a thickness of at least 3 nm (or at least 5 nm or at least 10 nm) and/or at most 50 nm (or at most 30 nm or at most 20 nm).

For example, a mobility enhancement layer may be located vertically between the polarization layer and the group III-N semiconductor layer 110. For example, the spacer layer may be an aluminum nitride layer having a thickness of at least 0.5 nm (or at least 1 nm or at least 2 nm) and/or at most 5 nm (or at most 4 nm or at most 3 nm). The AlN layer may work as additional polarization layer and may provide a different polarization field to GaN. However since lattice mismatch between AlN and GaN may be great so that a critical layer thickness may be very small. For example, only 1-2 nm of AlN can be grown which might not be enough to induce sufficient charge. In addition AlN may be a mobility enhancement layer, because as electrons travel near that interface having a binary compound (AlN) vs. tertiary (such as AlGaN, or InAlN) may provide fewer scattering centers.

A gate electrode of the field effect transistor may be located on the polarization layer. For example, the gate electrode may be in contact with the polarization layer. Alternatively, a gate insulation layer may be arranged between the gate electrode and the polarization layer. The gate insulation layer may comprise a same material and/or have a same height as the electrically insulating material layer 120, for example.

For example, the semiconductor device 100 may comprise a diode or a transistor, and the metal contact structure 130 may provide an electrical contact to an anode region of a diode, a cathode region of a diode, a drain region of a transistor, a source region of a transistor, a collector region of a transistor, an emitter region of a transistor, and/or a base region of a transistor of the semiconductor device 100.

For example, the highly doped portion of the group III-N semiconductor layer may provide a contact doping portion of an anode region of a diode, a portion of a cathode region of a diode, a portion of a drain region of a transistor, a portion of a source region of a transistor, a portion of a collector region of a transistor, a portion of an emitter region of a transistor, and/or a portion of a base region of a transistor of the semiconductor device.

The low resistance contact structure provided by the semiconductor device 100 may be applied in radio frequency applications, for example. The semiconductor device 100 may be used in RF devices like RF transistors. Alternatively, the semiconductor device 100 may be used, e.g. as low resistive contact structure of transistors or diodes, in the field of power electronics, e.g. in power devices or power converters.

For example, the semiconductor device to be provided in a power electronics application may be a power semiconductor device. A power semiconductor device or an electrical structure (e.g. transistor arrangement of the semiconductor device and/or diode arrangement of the semiconductor device) of the power semiconductor device may have a breakdown voltage or blocking voltage of more than 10V, more than 100 V or more than 500 V, for example.

More details and aspects are mentioned in connection with the embodiments described below. The embodiments shown in FIG. 1 may comprise one or more optional additional features corresponding to one or more aspects mentioned in connection with the proposed concept or one or more embodiments described below (e.g. FIGS. 2-7).

Figure 2:
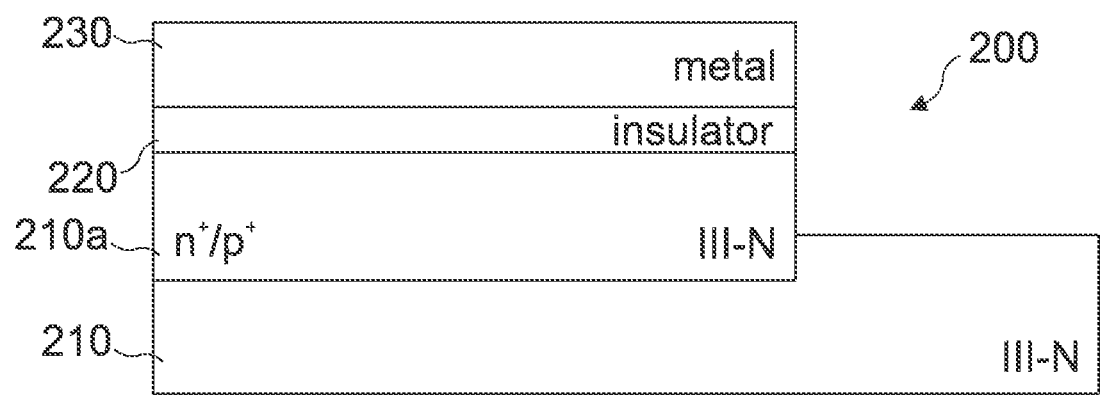
FIG. 2 shows a schematic cross section of a part of a semiconductor device with a group III-N semiconductor layer and a low resistive contact structure.

FIG. 2 shows an example of a semiconductor device 200 with a group III-N semiconductor layer 210 and a low resistive contact structure. The low resistive contact structure comprises a highly doped group III-N contact portion 210a, an electrically insulating material layer 220, and a metal contact structure 230. The highly doped group III-N contact portion 210a is located on a group III-N semiconductor layer 210. For example, the highly doped group III-N contact portion 210a is in contact with the group III-N semiconductor layer 210, e.g. epitaxially grown on the group III-N semiconductor layer 210.

The electrically insulating material layer 220 is located on, and e.g. in contact with, the highly doped group III-N contact portion 210a, and the metal contact structure 230 is located on, and e.g. in contact with, the electrically insulating material layer 220. The highly doped group III-N contact portion 210a may have a doping concentration of at least $1*10^{19}$ cm$^{-3}$ (or of at least $5*10^{19}$ cm$^{-3}$ or of at least $1*10^{20}$ cm$^{-3}$).

Providing the low resistive contact structure comprising the electrically insulating material layer 220 may enable a low resistive contact between the metal contact structure 230 and the group III-N semiconductor layer 210. The low electrical resistance of the proposed semiconductor device 200 may be achieved by implementation of the electrically insulating material layer 220 having a defined thickness and insulating material to allow a current flow through the electrically insulating material layer 220. In other words, the semiconductor device may be configured to conduct an electrical current or to provide a low-impedance conductive current path from the metal contact structure 230 to the group III-N semiconductor layer 210 through the electrically insulating material layer 220 and the highly doped group III-N contact portion 210a.

For example, an electrical resistance between the metal contact structure 230 and the group III-N semiconductor layer 210 through the electrically insulating material layer 220 and the highly doped group III-N contact portion 210a may be smaller than $1*10^{-6}\Omega$ (or smaller than $1*10^{-7}\Omega$) for an area of 1 mm$^2$.

More details and aspects are mentioned in connection with the embodiments described above or below. The embodiments shown in FIG. 2 may comprise one or more optional additional features corresponding to one or more aspects mentioned in connection with the proposed concept or one or more embodiments described above or below (e.g. FIGS. 1 and 3-7).

An aspect of the disclosure relates to a radio frequency (RF) device, e.g. a group III-N semiconductor RF device or a GaN RF device, comprising a field effect transistor and a low resistive contact structure of the field effect transistor. The low resistive contact structure comprises a highly doped group III-N contact portion, an electrically insulating material layer, and a metal contact structure. For example, the metal contact structure provides a drain contact or a source contact of the field effect transistor. The field effect transistor may be an RF transistor configured to switch between an on state and an off state with a frequency of at least 1 GHz (or at least 2 GHz, at least 5 GHz, at least 10 GHz, at least 20 GHz or at least 50 GHz) and/or at most 500 GHz (or at most 800 GHz).

For example, a thickness of the electrically insulating material layer of the RF device may be at least 0.3 nm and/or at most 2 nm. A doping concentration of the highly doped group III-N contact portion of the RF device may be at least $1*10^{19}$ cm$^{-3}$, for example. The RF device may further comprise a group III-N semiconductor layer in contact with the highly doped group III-N contact portion so that a low resistance contact is provided between the metal contact structure and the group III-N semiconductor layer of the RF device, for example.

More details and aspects of the radio frequency device are mentioned in connection with the embodiments described above or below. The embodiments of the radio frequency device may comprise one or more optional additional features corresponding to one or more aspects mentioned in connection with the proposed concept or one or more embodiments described above or below (e.g. FIGS. 1-7).

FIG. 3 shows an example of a semiconductor device 300 comprising a field effect transistor during manufacturing. The semiconductor device 300 comprises a group III-N semiconductor layer 310, for example a GaN layer, having a thickness between 200 nm and 5 μm, e.g. a thickness of 1 μm. Further, the semiconductor device 300 comprises a first highly doped group III-N contact portion 310a, a first electrically insulating material layer 320, and a first metal contact structure 330. The first highly doped group III-N contact portion 310a is in contact with the group III-N semiconductor layer 310 and in contact with the first electrically insulating material layer 320. The first highly doped group III-N contact portion 310a provides at least partly a drain region of the field effect transistor, and the first metal contact structure 330 may be a source contact of the field effect transistor of the semiconductor device 300, for example. The semiconductor device may be referred to as group III-N semiconductor device.

Further, the semiconductor device 300 comprises a second highly doped group III-N contact portion 312a, a second electrically insulating material layer 322, and a second metal contact structure 332. The second highly doped group III-N contact portion 312a is in contact with the group III-N semiconductor layer 310 and in contact with the second electrically insulating material layer 322. The second highly doped group III-N contact portion 312a provides at least partly a source region of the field effect transistor, and the second metal contact structure 332 may be a drain contact of the field effect transistor of the semiconductor device 300, for example.

The electrically insulating material layers 320, 322, e.g. insulators in the contact, may be between 0.3 nm-2 nm thick and may comprise Al2O3, TiO2, HfO2, ZrO2 or a combination of those. The metal contact structures 330, 332, e.g. metal layers, may comprise multiple layers, e.g. an adhesion and/or work function layer, e.g. comprising Ti or TiN or TaN that is 2-10 nm thick, and a metal fill, e.g. a metal portion, which e.g. provides low resistance for the bulk of the line, for example W or Al or similar. For example, the metal fill layer has a thickness dependent on an upper stack of the transistor of the device 300, for example between 50 nm-200 nm.

For example, the field effect transistor of the semiconductor device 300 is a high-electron-mobility transistor and a polarization layer 340 is provided on the group III-N semiconductor layer 310 to form a heterostructure with the group III-N semiconductor layer 310 and to enable accumulation of electrons or a formation of a two-dimensional electron gas at an interface of the polarization layer 340 and the group III-N semiconductor layer 310 within the group III-N semiconductor layer 310. For example, the polarization layer 340 comprises aluminum gallium nitride AlGaN, indium aluminum nitride InAlN, and/or quartenary indium aluminum gallium nitride InAlGaN. The polarization layer is between 5 nm-30 nm thick, for example. For example, an AlN layer 342 of a thickness of the order of 1 nm-3 nm is located vertically between the polarization layer 340 and the GaN layer 310. The polarization layer 340 may be covered by a hard mask HM layer 344 (e.g. silicon nitride layer or silicon oxide layer or a titanium nitride layer) during formation of the highly doped group III-N contact portions and the electrically insulating material layer, for example. The hard mask layer 344 may be removed afterwards and a gate dielectric and a gate electrode of the field effect transistor may be formed on the polarization layer 340.

The GaN layer 310 is located on a III-N buffer stack 350 having a thickness on the order of e.g. having a thickness within the range of 200 nm-5 μm. The buffer stack 350 may be located on a silicon substrate 355, for example a Si (111) HR substrate.

The first and/or second highly doped group III-N contact portion 310a, 312a may be a N+ layer, e.g. comprising GaN or InGaN, and being doped with Si, e.g., having a doping concentration of more than $1*10^{19}$ cm$^{-3}$, e.g. up to $5*10^{20}$ cm$^{-3}$. The N+ layer may have a thickness of 50 nm-150 nm, and may be in part connected to an amount of an etchout of the group III-N semiconductor layer 310, e.g. a GaN layer, (e.g. shown in FIG. 6d). For example, a top surface of the highly doped group III-N contact portions 310a, 312a may be at least 10 nm (or at least 30 nm) and/or at most 100 nm (or at most 50 nm) higher than a top surface of the polarization layer 340 in a cross section of the semiconductor device 300.

For example, FIG. 3 shows an example of a structure proposed according to the present concept. An aspect may be seen in forming a metal-insulator-semiconductor tunneling (MIST) contact (e.g. by providing the insulating layer) or a contact similar to a MIST contact which may improve contact resistance despite adding an insulator in the stack. This may be achieved by same insulator acting as a buffer between metal and III-N, e.g. GaN, semiconductor allowing the bands to "unpin", meaning that Fermi levels of the two materials may reach equilibrium (see e.g. the band model shown in FIG. 4). For example, the choice of metal may be made so as to minimize the barrier between the metal work function and conduction band of GaN semiconductor. An aspect of proposed concepts may be to properly balance the choice of insulator (e.g. TiO2, HfO2, etc.) as well as its thickness so that the effect of unpinning overcomes the effect of adding insulator in the stack.

More details and aspects are mentioned in connection with the embodiments described above or below. The embodiments shown in FIG. 3 may comprise one or more optional additional features corresponding to one or more aspects mentioned in connection with the proposed concept or one or more embodiments described above or below (e.g. FIGS. 1 and 2 and 4-7).

Figure 4:
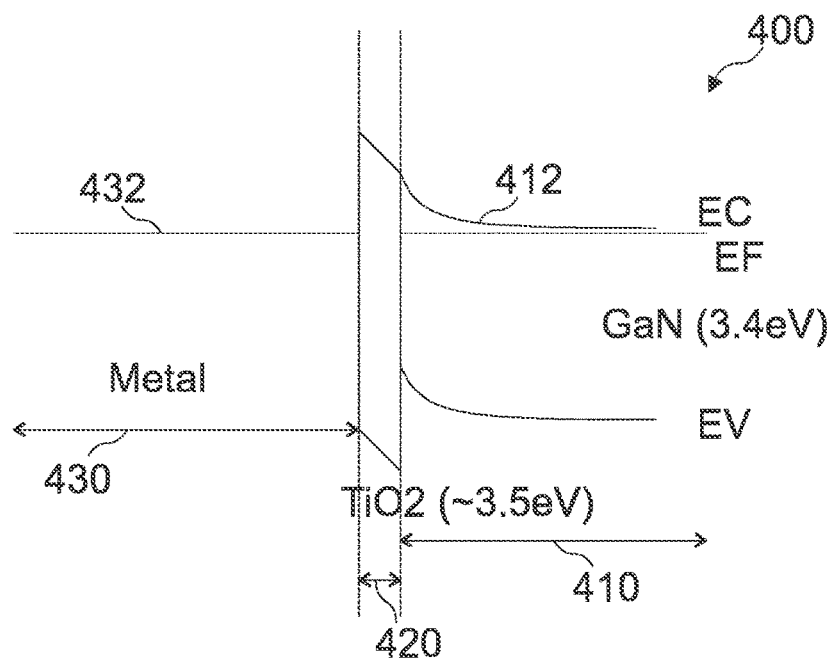
FIG. 4 schematically shows a band scheme of a semiconductor device with an electrically insulating material layer.

FIG. 4 schematically shows a band scheme of a semiconductor device with low resistive contact structure comprising an electrically insulating material layer (e.g. as shown in FIGS. 1, 2 and 3). An example of a band diagram 400 is shown upon insertion of an insulator 420 (e.g. the electrically insulating material layer) in the metal-semiconductor stack, e.g. between the metal contact structure and the group III-N semiconductor layer. A low band offset of a Fermi level 432 of a metal 430, e.g. the metal of the metal contact structure, to a conduction band 412 of a semiconductor material 410, e.g. the semiconductor material of the group III-N semiconductor layer or the highly doped group III-N contact portion, is shown, which may result in a lower contact resistance of this stack, for example. In addition, as e.g. the band gap of the semiconductor material 410, e.g. GaN is similar to that of many insulators (e.g. insulating materials mentioned above, e.g. TiO2), a GaN MIST contact in fact may fully eliminate tunneling and rather rely on conventional thermionic emission over the barrier (e.g. introduced by adding the insulating layer 420).

Figure 5:
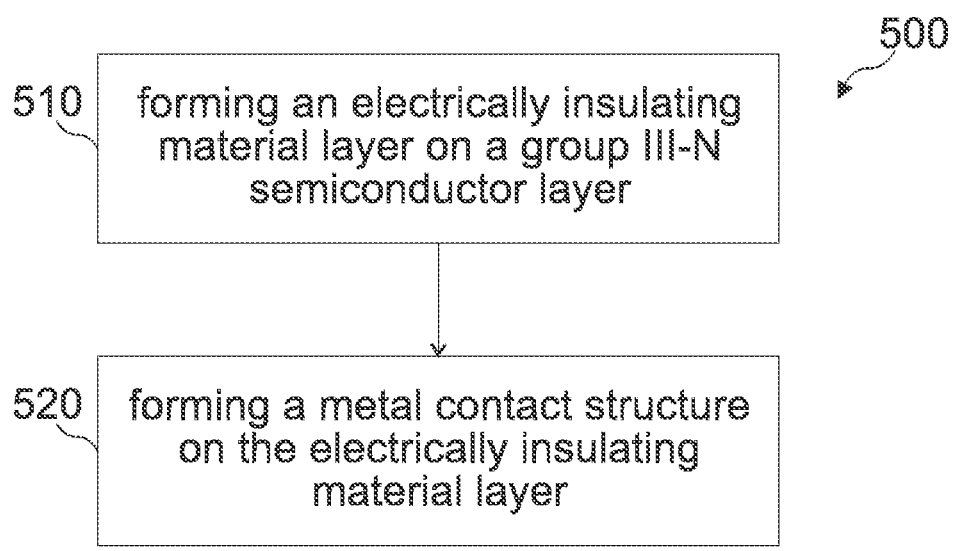
FIG. 5 shows a flow chart of an exemplary method for forming a semiconductor device.

FIG. 5 shows a flow chart of an exemplary method 500 for forming a semiconductor device. The method 500 comprises forming 510 an electrically insulating material layer on a group III-N semiconductor layer. The method 500 further comprises forming 520 a metal contact structure on the electrically insulating material layer. According to the method 500, a low electrical resistance between the metal contact structure and the group III-N semiconductor layer through the electrically insulating material layer is achieved, wherein the electrical resistance is smaller than $1*10^{-6}Ω$ (or smaller than $1*10^{-7}Ω$) for an area of 1 mm$^2$.

The method 500 may enable manufacturing or forming a semiconductor device 100, 200, 300 as described before. For example, an electrical resistance between the metal contact structure and the group III-N semiconductor layer of a device formed according to the method 500 may be smaller compared to another device, e.g. having a same conductive area as the formed semiconductor device.

For example, the method 500 may comprise forming the group III-N semiconductor layer on a silicon substrate, e.g. by means of epitaxial growth. Alternatively, a group III-N buffer layer may be formed on the silicon substrate, and the group III-N semiconductor layer may be formed on the group III-N buffer layer. The group III-N buffer layer may have a thickness of at least 100 nm and of at most 8 μm.

For example, a highly doped group III-N contact portion may be formed on the group III-N semiconductor layer, e.g. before forming 510 the electrically insulating material layer. The highly doped group III-N contact portion may be formed on a portion, e.g. a lateral part, of the group III-N semiconductor layer, e.g. by means of epitaxial growth. For example, a vertical extension of the highly doped group III-N contact portion may be at least 20 nm and at most 250 nm. The highly doped group III-N contact portion may have a doping concentration of at least $1*10^{19}$ cm$^{-3}$. For example, a portion of the group III-N semiconductor layer may be doped to form the highly doped group III-N contact portion in said portion of the group III-N semiconductor layer.

For example, the electrically insulating material layer may be formed 510 after forming the group III-N semiconductor layer and before forming 520 the metal contact structure. The electrically insulating material layer may be an oxide layer or a nitride layer. The electrically insulating material layer may have a thickness of at least 0.2 nm and at most 3 nm.

For example, forming the metal contact structure may comprise forming an adhesion layer, e.g. comprising at least one of titanium, titanium nitride, and tantalum nitride, in contact with the electrically insulating material layer. The adhesion layer may have a thickness of at least 1 nm and at most 20 nm. Further, a metal layer of the metal contact structure may be formed in contact with the adhesion layer, the metal layer comprising at least one of copper, tungsten and aluminum. The adhesion layer and the metal layer of the metal contact structure may be structured together or at least by using the same mask.

The method 500 may comprise forming a field effect transistor of the semiconductor device, e.g. an RF device. The field effect transistor to be formed may be an RF transistor, e.g. configured to switch on and off with a frequency higher than 1 GHz. For example, the metal contact structure may be a source contact of the field effect transistor to be formed. Accordingly, a further metal contact structure may be a drain contact of the field effect transistor of the semiconductor device.

More details and aspects are mentioned in connection with the embodiments described above or below. The embodiments shown in FIG. 5 may comprise one or more optional additional features corresponding to one or more aspects mentioned in connection with the proposed concept or one or more embodiments described above or below (e.g. FIGS. 1-4 and 6a-7).

FIGS. 6a to 6i show an example of a method for forming a semiconductor device comprising metal-insulator-semiconductor contacts of a transistor.

Figure 6A:
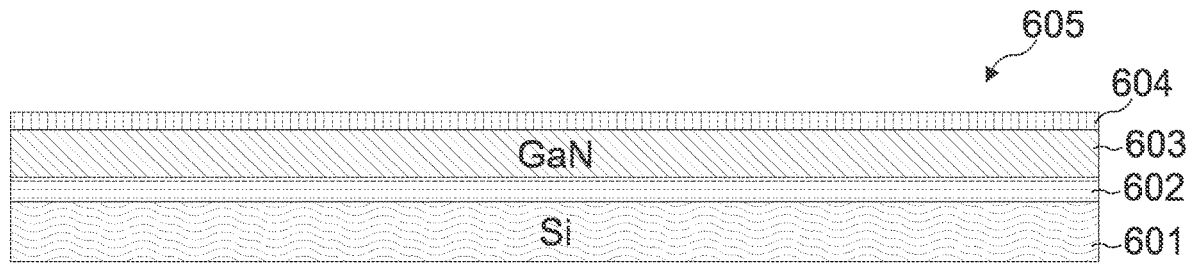
FIGS. 6a to 6i show schematic cross sections of a part of a semiconductor device during manufacturing.

FIG. 6a shows the semiconductor device to be formed after providing 605 a silicon (Si) substrate 601, a III-N buffer layer 602 formed on the Si substrate 601, a GaN layer 603 formed on the III-N buffer layer 602, and a polarization layer 604 formed on the GaN layer 603. The III-N buffer layer 602 may be deposited or grown on the Si substrate 601, and the GaN layer 603 and the polarization layer 604 may be epitaxially grown subsequently. The polarization layer 604 may comprise AlGaN, InAlN, or quaternary InAlGaN, for example.

A thickness of the grown polarization layer 604 may be larger than 30 nm, for example. Optionally, an AlN layer may be formed between the polarization layer 604 and the GaN layer 603. A thickness of the AlN layer may be between 1 nm and 3 nm. For example, both the III-N buffer stack or buffer layer 602 and GaN layer 603 may be formed having a thickness of about e.g. a thickness of at least 200 nm and up to 5 µm.

Figure 6B:
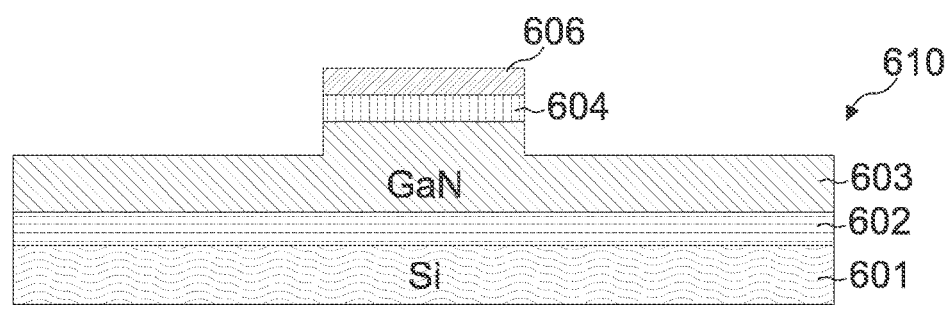

FIG. 6b shows the semiconductor device to be formed after providing 610 a shallow trench isolation. An insulator or insulation layer 606, e.g. an ILD (inter-level dielectric) film, is deposited on the polarization layer 604. For example, the insulator 606 and the polarization layer 604 are completely etched and the GaN layer is partly etched at unmasked areas.

Figure 6C:
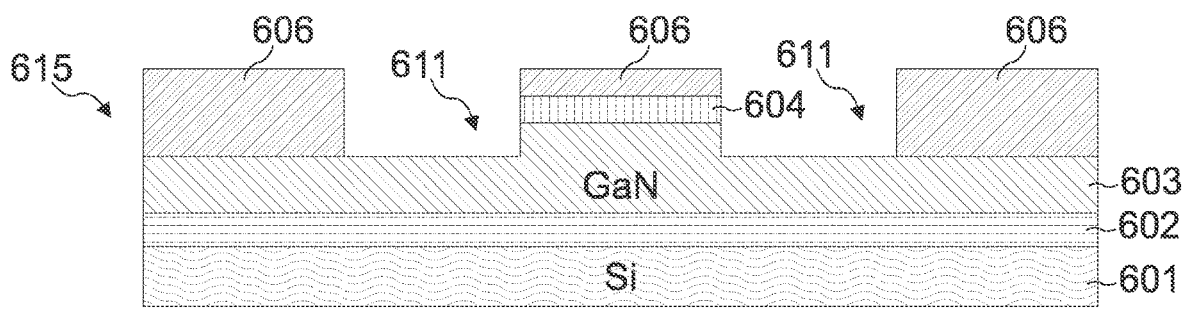

FIG. 6c shows the semiconductor device to be formed after forming 615 trenches 611 for subsequent source-drain formation adjacent to the polarization layer 604.

Figure 6D:
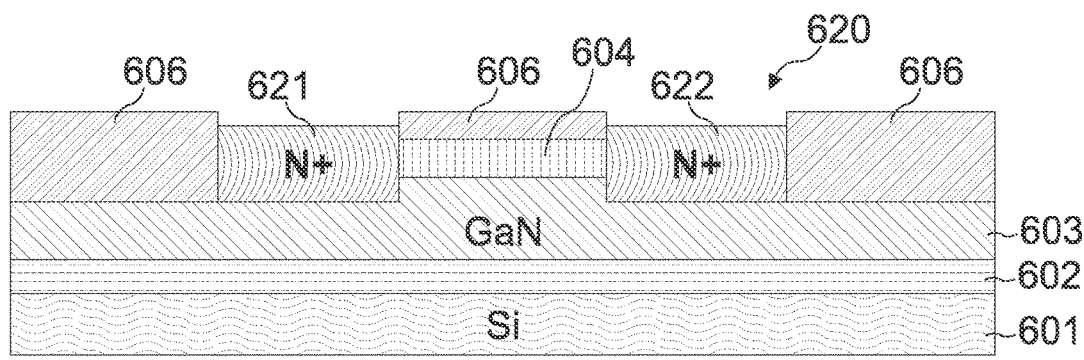

FIG. 6d shows the semiconductor device to be formed after epitaxially growing 620 a highly n-doped source region 621 in a first trench, and a highly n-doped drain region 622 in a second trench of the trenches 611. Both the source region 621 and the drain region 622 may comprise GaN and may be highly doped, e.g. with a doping concentration of at least $1 \, e19/cm^3$, e.g. up to $5 \, e20/cm^3$.

Figure 6E:
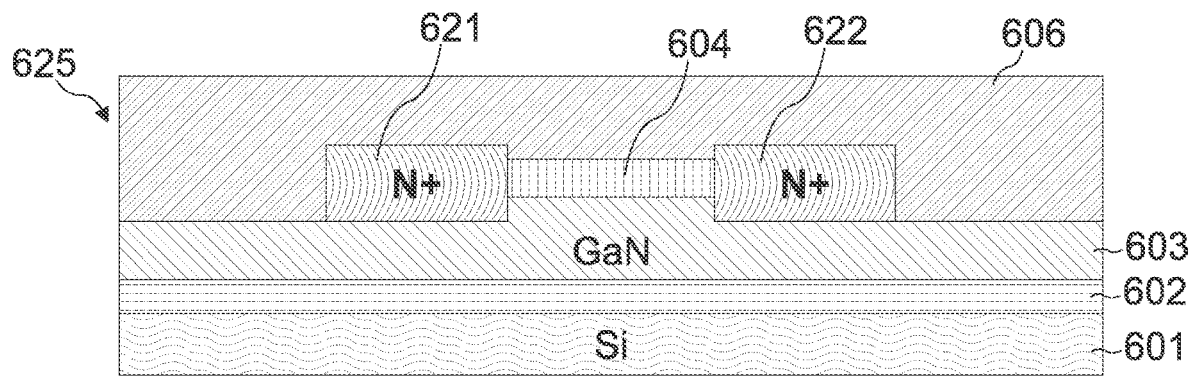

FIG. 6e shows the semiconductor device to be formed after forming 625 another insulation layer as portion of the ILD 606.

Figure 6F:
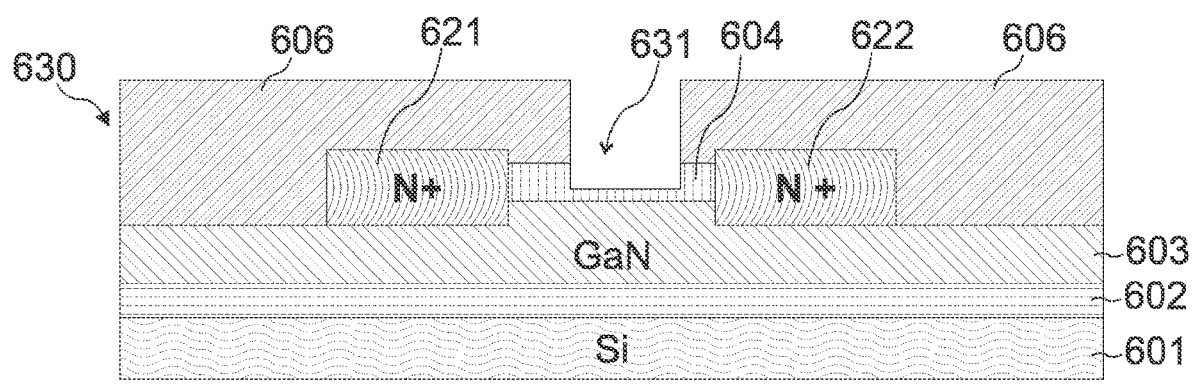

FIG. 6f shows the semiconductor device to be formed after etching 630 a portion of the insulation layer 606 and a portion of the polarization layer 604 located between the source region 621 and the drain region 622, to provide a trench 631 for forming a gate of the transistor. For example, the polarization layer 604 is partly recessed. A thickness of the polarization layer 604 within the recessed region may be between 5 nm and 30 nm, for example.

Figure 6G:
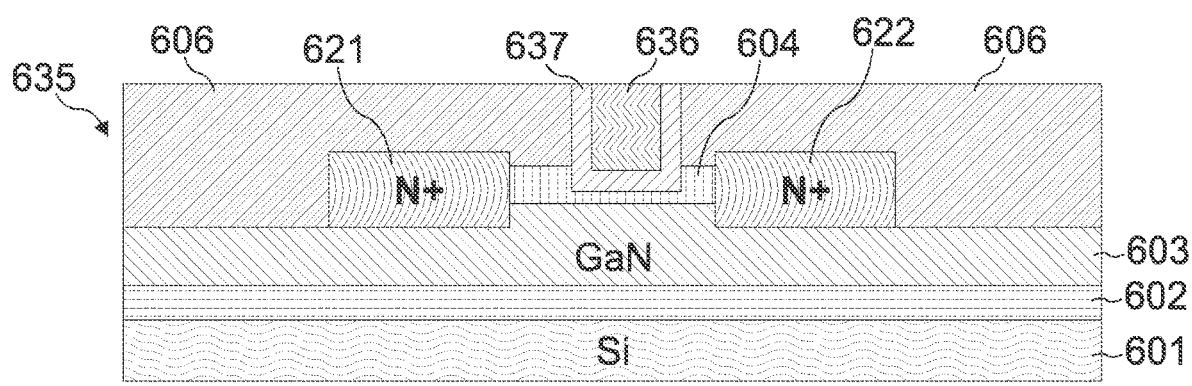

FIG. 6g shows the semiconductor device to be formed after forming 635 a gate structure of the semiconductor device. The gate structure may comprise at least a gate contact structure, comprising gate metal 636. Optionally, the gate structure may further comprise a gate dielectric 637. For example, the gate dielectric 637 may be formed within the trench 631 to insulate the gate metal 636 from the polarization layer 604. For example, the gate dielectric 637 may be a single insulating material layer (e.g. Al2O3 layer, HfO2 layer or ZrO2 layer) or may comprise two or more insulating material sublayers. Subsequently, a remaining part of trench 631 may be filled with the gate metal 636. For example, only a gate metal 636 may be filled in the trench or layers of work function metals may be formed adjacent to the gate dielectric 637. In other words, multiple layers as work function metals (e.g. closest to gate dielectric) and/or metal fills (e.g. larger volume metals) may be implemented as gate, since metal that may set the work function might not have a sufficiently low resistivity.

Figure 6H:
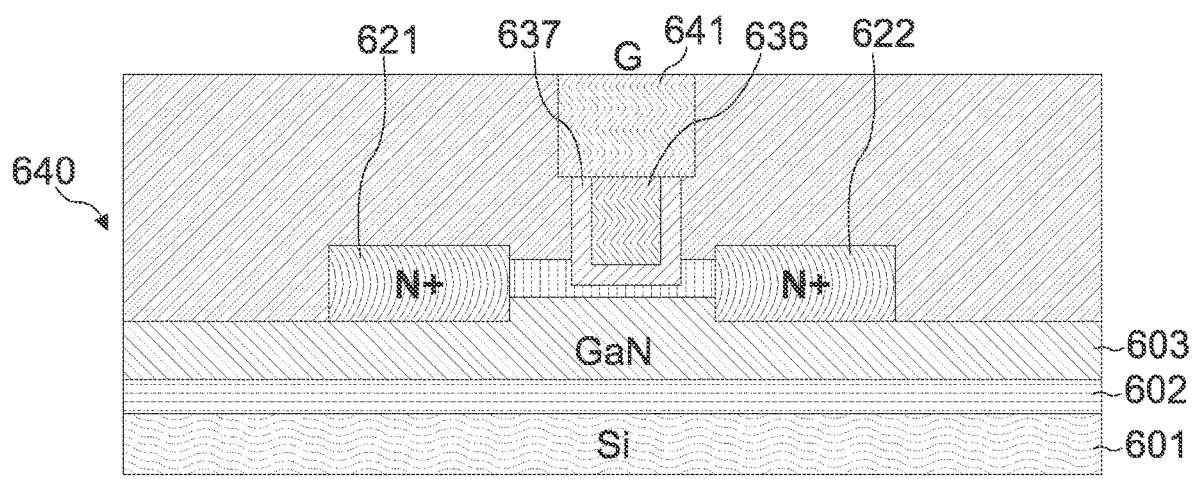

FIG. 6h shows the semiconductor device to be formed after further forming 640 a topgate portion 641, e.g. as part of a gate contact structure. The topgate portion 641 may comprise the same electrically conductive material as the gate metal 636.

Figure 6I:
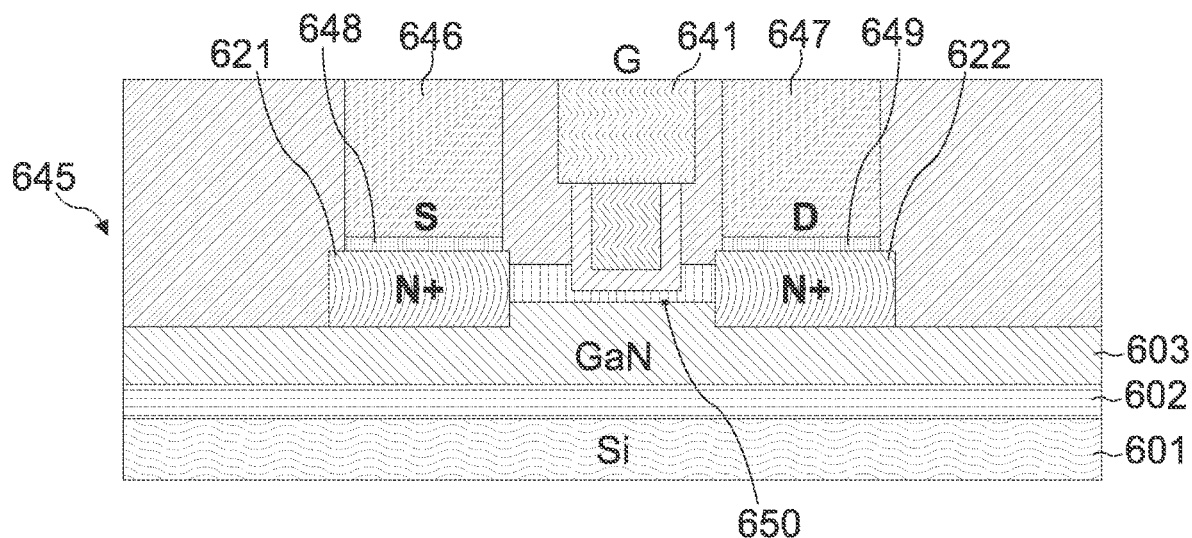

FIG. 6i shows the semiconductor device to be formed after forming 645 a source contact structure 646 and a drain contact structure 647 of the semiconductor device. For example, trenches may be formed within the insulation layer 606 in a lateral region of the source region 621 and the drain region 622. The source contact structure 646 and a drain contact structure 647 may be formed within said trenches. For example, before forming 645 the contact structures, a first portion 648 of an electrically insulating material layer may be formed on and in contact with the source region 621, and a second portion 649 of the electrically insulating material layer may be formed on and in contact with the drain region 622. The electrically insulating material layer may have a thickness of less than 3 nm.

The source contact structure 646, the first portion 648 of the electrically insulating material layer, and the source region 621, as well as the drain contact structure 647, the second portion 649 of the electrically insulating material layer, and the drain region 622 each provide a low resistive contact structure or respective metal-insulator-semiconductor contacts of the semiconductor device to be formed according to low resistive contacts proposed within the present disclosure.

For example, by providing the electrically insulating material layers 648, 649, an on-resistance of the transistor of the semiconductor device may be reduced. The semiconductor device may be a field effect transistor, e.g. a high-electron-mobility transistor, with a transistor channel at an interface 650 between the GaN layer 603 and the polarization layer 604. For example, the transistor channel may be provided by a two-dimensional electron gas within the GaN layer 603 at the interface 650. By providing the low resistance source and drain contacts due to introducing the electrically insulating material layers 648, 649, a functionality of the transistor may be further improved, especially in view of requirements of modern RF applications.

In an alternative implementation of the method shown in FIGS. 6a to 6i, the gate dielectric 637 and the electrically insulating material layer may be formed in a common process step at the same time. For example, the trench 631 may be formed while providing trenches over the source region 621 and the drain region 622 before forming the gate metal. Then, the gate dielectric 637 and the two portions 648, 649 of the electrically insulating material layer may be formed together, and subsequently, the respective contact structures may be formed on the respective insulators for providing source, gate, and drain contacts.

More details and aspects are mentioned in connection with the embodiments described above or below. The embodiments shown in FIGS. 6a to 6i may comprise one or more optional additional features corresponding to one or more aspects mentioned in connection with the proposed concept or one or more embodiments described above or below (e.g. FIGS. 1-5 and 7).

Figure 7:
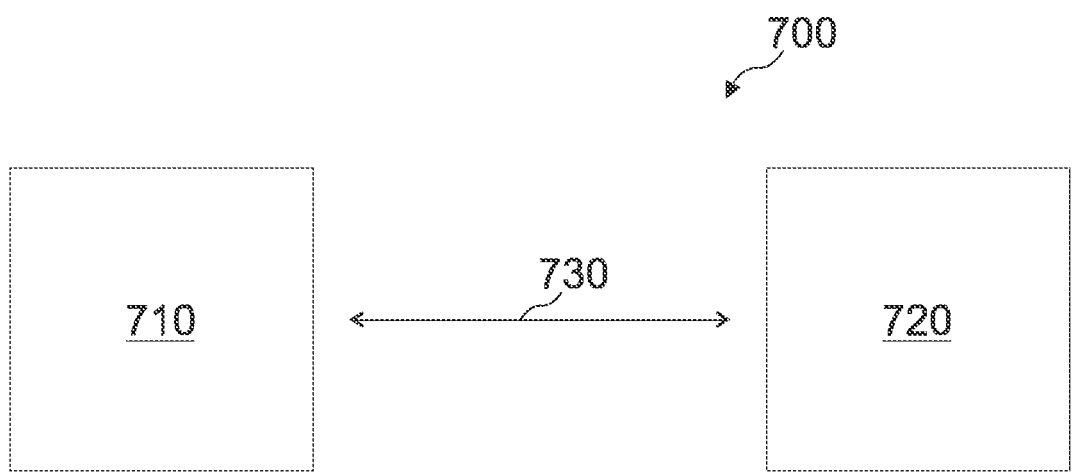
FIG. 7 shows a schematic example of a communication system comprising a semiconductor device.

FIG. 7 shows an example of a communication system 700 comprising a user equipment 710 and a service device 720, e.g. a stationary communication device, e.g. a base station, a router, or a gateway. The user equipment may be a mobile phone, a smartphone, a computer, or a laptop, for example. The communication system 700 may be configured to establish a wireless connection 730, e.g. a radio connection, between the user equipment 710 and the service device 720. The user equipment 710 and/or the service device 720 may comprise at least one semiconductor device 100, 200, 300 according to a proposed semiconductor device in a transceiver path (transmitting path and/or receiving path) of the user equipment 710 and/or the service device 720.

More details and aspects are mentioned in connection with the embodiments described above or below. The embodiments shown in FIG. 7 may comprise one or more optional additional features corresponding to one or more aspects mentioned in connection with the proposed concept or one or more embodiments described above or below (e.g. FIGS. 1-6i).

An aspect of the present application relates to a metal insulator semiconductor contact for GaN based RF technology. Another aspect relates to methods for forming a metal insulator semiconductor contact for GaN based RF technology.

Providing an insulator between a metal and a semiconductor material for a metal-insulator-semiconductor tunneling contact may be used for other semiconductor materials as well, e.g. group IV (Si, SiGe, Ge, etc.) or group III-V (InGaAs, InSb, InAs, InP, GaAs, etc.) semiconductors.

Other solutions may include annealing metal into undoped GaN or direct metal contact onto highly doped, re-grown III-N source/drain, for example. An effect of these approaches may be a large contact resistance between metal and GaN channel which may limit performance of devices. This high resistance may be limited by the large Schottky barrier between metal and III-N, in large part due to large bandgap of III-N semiconductor. Further, different high temperature processing (such as metal anneal into undoped GaN) may be necessary which may not be compatible with other processing (e.g. high-K/metal gate).

Further examples relate to further aspects of the present disclosure.

Example 1 relates to a semiconductor device comprising a group III-N semiconductor layer; an electrically insulating material layer located on the group III-N semiconductor layer; and a metal contact structure located on the electrically insulating material layer, wherein an electrical resistance between the metal contact structure and the group III-N semiconductor layer through the electrically insulating material layer is smaller than $1*10^{-7}\Omega$ for an area of 1 mm$^2$.

Example 2 relates to the semiconductor device according to example 1, wherein a thickness of the electrically insulating material layer is at least 0.3 nm and at most 2 nm.

Example 3 relates to the semiconductor device according to example 1 or 2, wherein the electrically insulating material layer is an oxide layer.

Example 4 relates to the semiconductor device according to one of the preceding examples 1 to 3, wherein a thickness of the group III-N semiconductor layer is at least 100 nm and at most 8 µm.

Example 5 relates to the semiconductor device according to one of the preceding examples 1 to 4, comprising a highly doped group III-N contact portion located between the electrically insulating material layer and a portion of the group III-N semiconductor layer, wherein a doping concentration of the highly doped group III-N contact portion is at least $1*10^{19}$ cm$^{-3}$.

Example 6 relates to the semiconductor device according to example 5, wherein a vertical dimension of the highly doped group III-N contact portion is at least 20 nm and at most 250 nm.

Example 7 relates to the semiconductor device according to one of the preceding examples 1 to 6, wherein the group III-N semiconductor layer is located on a group III-N buffer layer.

Example 8 relates to the semiconductor device according to example 7, wherein the group III-N buffer layer has a thickness of at least 100 nm and of at most 8 µm.

Example 9 relates to the semiconductor device according to one of the preceding examples 1 to 8, wherein the metal contact structure comprises a sublayer comprising at least one of titanium, titanium nitride, and tantalum nitride.

Example 10 relates to the semiconductor device according to example 9, wherein the sublayer of the metal contact structure has a thickness of at least 1 nm and of at most 20 nm.

Example 11 relates to the semiconductor device according to one of the preceding examples 1 to 10, wherein the metal contact structure comprises a metal portion comprising at least one of copper, tungsten and aluminum.

Example 12 relates to the semiconductor device according to example 11 referring to example 9, wherein the metal portion of the metal contact structure is located on the sublayer.

Example 13 relates to the semiconductor device according to one of the preceding examples 1 to 12, wherein the group III-N semiconductor layer is located on a silicon substrate.

Example 14 relates to the semiconductor device according to one of the preceding examples 1 to 13, wherein the metal contact structure is a source contact of a field effect transistor of the semiconductor device.

Example 15 relates to the semiconductor device according to one of the preceding examples 1 to 14, further comprising a further metal contact structure.

Example 16 relates to the semiconductor device according to example 15, wherein the semiconductor device is configured to conduct a current between the metal contact structure and the further metal contact structure through the electrically insulating material layer and the group III-N semiconductor layer.

Example 17 relates to the semiconductor device according to example 15 or 16, wherein the further metal contact structure is a drain contact of the field effect transistor of the semiconductor device.

Example 18 relates to the semiconductor device according to example 17, wherein the field effect transistor of the semiconductor device further comprises a polarization layer located on the group III-N semiconductor layer and positioned laterally between the source contact and the drain contact of the field effect transistor.

Example 19 relates to the semiconductor device according to example 18, wherein the polarization layer is an aluminum gallium nitride layer, an indium aluminum nitride layer, or an indium aluminum gallium nitride layer.

Example 20 relates to the semiconductor device according to example 18 or 19, wherein the polarization layer has a thickness of at least 3 nm and at most 50 nm.

Example 21 relates to the semiconductor device according to example 18, 19 or 20, further comprising an aluminum nitride layer located vertically between the polarization layer and the group III-N semiconductor layer, wherein the aluminum nitride layer has a thickness of at least 0.5 nm and at most 5 nm.

Example 22 relates to the semiconductor device according to one of the preceding examples 18 to 21, wherein a gate electrode of the field effect transistor is located on the polarization layer.

Example 23 relates to the semiconductor device according to one of the preceding examples 14 to 22, wherein the field effect transistor is a lateral transistor.

Example 24 relates to the semiconductor device according to one of the preceding examples 14 to 23, wherein the field effect transistor is a high-electron-mobility transistor.

Example 25 relates to the semiconductor device according to one of the preceding examples, wherein the metal contact structure provides an electrical contact to at least one of an anode region of a diode, a cathode region of a diode, a drain region of a transistor, a source region of a transistor, a collector region of a transistor, an emitter region of a transistor, and a base region of a transistor of the semiconductor device.

Example 26 relates to a semiconductor device comprising: a group III-N semiconductor layer; and a low resistive contact structure comprising a highly doped group III-N contact portion, an electrically insulating material layer and a metal contact structure, wherein the low resistive contact structure is located on the group III-N semiconductor layer, wherein the electrically insulating material layer is located on the highly doped group III-N contact portion, and the metal contact structure is located on the electrically insulating material layer, wherein the highly doped group III-N contact portion has a doping concentration of at least $1*10^{19}$ cm$^{-3}$.

Example 27 relates to the semiconductor device according to example 26, wherein a thickness of the electrically insulating material layer is at least 0.3 nm and at most 2 nm.

Example 28 relates to the semiconductor device according to example 26 or 27, wherein the electrically insulating material layer is an oxide layer.

Example 29 relates to the semiconductor device according to one of the preceding examples 26 to 28, wherein a thickness of the group III-N semiconductor layer is at least 100 nm and at most 8 µm.

Example 30 relates to the semiconductor device according to one of the preceding examples 26 to 29, wherein a vertical dimension of the highly doped group III-N contact portion is at least 20 nm and at most 250 nm.

Example 31 relates to the semiconductor device according to one of the preceding examples 26 to 30, wherein the group III-N semiconductor layer is located on a group III-N buffer layer.

Example 32 relates to the semiconductor device according to example 31, wherein the group III-N buffer layer has a thickness of at least 100 nm and of at most 8 µm.

Example 33 relates to the semiconductor device according to one of the preceding examples 26 to 32, wherein the metal contact structure comprises a sublayer comprising at least one of titanium, titanium nitride, and tantalum nitride.

Example 34 relates to the semiconductor device according to example 33, wherein the sublayer of the metal contact structure has a thickness of at least 1 nm and of at most 20 nm.

Example 35 relates to the semiconductor device according to one of the preceding examples 26 to 34, wherein the metal contact structure comprises a metal portion comprising at least one of copper, tungsten and aluminum.

Example 36 relates to the semiconductor device according to example 35 referring to example 33, wherein the metal portion of the metal contact structure is located on the sublayer.

Example 37 relates to the semiconductor device according to one of the preceding examples 26 to 36, wherein the group III-N semiconductor layer is located on a silicon substrate.

Example 38 relates to the semiconductor device according to one of the preceding examples 26 to 37, wherein the metal contact structure is a source contact of a field effect transistor of the semiconductor device.

Example 39 relates to the semiconductor device according to one of the preceding examples 26 to 38, further comprising a further metal contact structure.

Example 40 relates to the semiconductor device according to example 39, wherein the semiconductor device is configured to conduct a current between the metal contact structure and the further metal contact structure through the electrically insulating material layer and the group III-N semiconductor layer.

Example 41 relates to the semiconductor device according to example 39 or 40, wherein the further metal contact structure is a drain contact of the field effect transistor of the semiconductor device.

Example 42 relates to the semiconductor device according to example 41, wherein the field effect transistor of the semiconductor device further comprises a polarization layer located on the group III-N semiconductor layer and positioned laterally between the source contact and the drain contact of the field effect transistor.

Example 43 relates to The semiconductor device according to example 42, wherein the polarization layer is an aluminum gallium nitride layer, an indium aluminum nitride layer, or an indium aluminum gallium nitride layer.

Example 44 relates to the semiconductor device according to example 42 or 43, wherein the polarization layer has a thickness of at least 3 nm and at most 50 nm.

Example 45 relates to the semiconductor device according to example 42, 43 or 44, further comprising an aluminum nitride layer located vertically between the polarization layer and the group III-N semiconductor layer, wherein the aluminum nitride layer has a thickness of at least 0.5 nm and at most 5 nm.

Example 46 relates to the semiconductor device according to one of the preceding examples 42 to 45, wherein a gate electrode of the field effect transistor is located on the polarization layer.

Example 47 relates to the semiconductor device according to one of the preceding examples 39 to 46, wherein the field effect transistor is a lateral transistor.

Example 48 relates to the semiconductor device according to one of the preceding examples 39 to 47, wherein the field effect transistor is a high-electron-mobility transistor.

Example 49 relates to the semiconductor device according to one of the preceding examples 26 to 48, wherein the metal contact structure provides an electrical contact to at least one of an anode region of a diode, a cathode region of a diode, a drain region of a transistor, a source region of a transistor, a collector region of a transistor, an emitter region of a transistor, and a base region of a transistor of the semiconductor device.

Example 50 relates to a radio frequency device comprising: a field effect transistor; and a low resistive contact structure of the field effect transistor, wherein the low resistive contact structure comprises a highly doped group III-N contact portion, an electrically insulating material layer and a metal contact structure, wherein the metal contact structure provides a drain contact or a source contact of the field effect transistor, wherein the field effect transistor is configured to switch between an on state and an off state with a frequency of at least 1 GHz.

Example 51 relates to the radio frequency device according to example 50, wherein a thickness of the electrically insulating material layer is at least 0.3 nm and at most 2 nm.

Example 52 relates to the radio frequency device according to example 50 or 51, wherein a doping concentration of the highly doped group III-N contact portion is at least $1*10^{19}$ cm$^{-3}$.

Example 53 relates to a method for forming a semiconductor device, the method comprising: forming an electrically insulating material layer on a group III-N semiconductor layer; and forming a metal contact structure on the electrically insulating material layer; wherein an electrical resistance between the metal contact structure and the group III-N semiconductor layer through the electrically insulating material layer is smaller than $1*10^{-7}\Omega$ for an area of 1 mm$^2$.

Example 54 relates to The method according to example 53, wherein the electrically insulating material layer has a thickness of at least 0.3 nm and at most 2 nm.

Example 55 relates to the method according to example 53 or 54, wherein the electrically insulating material layer is an oxide layer.

Example 56 relates to the method according to one of examples 53 to 55, wherein the group III-N semiconductor layer has a thickness of at least 100 nm and at most 8 μm.

Example 57 relates to the method according to one of examples 53 to 56, further comprising forming a highly doped group III-N contact portion between the electrically insulating material layer and a portion of the group III-N semiconductor layer, wherein a doping concentration of the highly doped group III-N contact portion is at least $1*10^{19}$ cm$^{-3}$.

Example 58 relates to the method according to example 57, wherein the highly doped group III-N contact portion has a vertical extension of at least 20 nm and at most 250 nm.

Example 59 relates to the method according to one of examples 53 to 58, wherein the group III-N semiconductor layer is formed on a group III-N buffer layer.

Example 60 relates to the method according to example 59, wherein the group III-N buffer layer has a thickness of at least 100 nm and of at most 8 μm.

Example 61 relates to the method according to one of examples 53 to 60, wherein forming the metal contact structure comprises forming a sublayer comprising at least one of titanium, titanium nitride, and tantalum nitride.

Example 62 relates to the method according to example 61, wherein the sublayer of the metal contact structure has a thickness of at least 1 nm and at most 20 nm.

Example 63 relates to the method according to one of examples 53 to 62, wherein forming the metal contact structure comprises forming a metal portion comprising at least one of copper, tungsten and aluminum.

Example 64 relates to the method according to example 63 referring to example 61, wherein the metal portion of the metal contact structure is formed on the sublayer.

Example 65 relates to the method according to one of examples 53 to 64, wherein the group III-N semiconductor layer is formed on a silicon substrate.

Example 66 relates to the method according to one of examples 53 to 65, wherein the metal contact structure is a source contact of a field effect transistor of the semiconductor device.

Example 67 relates to the method according to one of examples 53 to 66, further comprising forming a further metal contact structure.

Example 68 relates to the method according to example 67, wherein the further metal contact structure is a drain contact of the field effect transistor of the semiconductor device.

Example 69 relates to the method according to example 68, further comprising forming a polarization layer of the field effect transistor on the group III-N semiconductor layer and positioned laterally between the source contact and the drain contact of the field effect transistor.

Example 70 relates to the method according to example 69, wherein the polarization layer is an aluminum gallium nitride layer, an indium aluminum nitride layer, or an indium aluminum gallium nitride layer.

Example 71 relates to the method according to example 69 or 70, wherein the polarization layer has a thickness of at least 3 nm and at most 50 nm.

Example 72 relates to the method according to example 70 or 71, further comprising forming an aluminum nitride layer vertically between the polarization layer and the group III-N semiconductor layer, wherein the aluminum nitride layer has a thickness of at least 0.5 nm and at most 5 nm.

Example 73 relates to the method according to one of the preceding examples 70 to 72, wherein a gate structure of the field effect transistor is formed on the polarization layer.

Example 74 relates to the method according to one of the preceding examples 53 to 73, wherein the electrically insulating material layer and a gate insulation layer are formed simultaneously.

Example 75 relates to the method according to one of examples 53 to 74, wherein the metal contact structure is an electrical contact to at least one of an anode region of a diode, a cathode region of a diode, a drain region of a transistor, a source region of a transistor, a collector region of a transistor, an emitter region of a transistor, and a base region of a transistor of the semiconductor device.

Example 76 relates to the method according to one of examples 53 to 75, wherein the semiconductor device is a radio frequency device.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A semiconductor device comprising:
   a group III-N semiconductor layer;
   an electrically insulating material layer located on the group III-N semiconductor layer; and
   a metal contact structure located on the electrically insulating material layer,
   wherein an electrical resistance between the metal contact structure and the group III N semiconductor layer through the electrically insulating material layer is smaller than $1*10^{-7}\Omega$ for an area of 1 mm$^2$.

2. The semiconductor device according to claim 1, wherein a thickness of the electrically insulating material layer is at least 0.3 nm and at most 2 nm.

3. The semiconductor device according to claim 1, wherein the electrically insulating material layer is an oxide layer.

4. The semiconductor device according to claim 1, wherein a thickness of the group III-N semiconductor layer is at least 100 nm and at most 8 µm.

5. The semiconductor device according to claim 1, comprising a highly doped group III-N contact portion located between the electrically insulating material layer and a portion of the group III-N semiconductor layer, wherein a doping concentration of the highly doped group III-N contact portion is at least $1*10^{19}$ cm$^{-3}$.

6. The semiconductor device according to claim 5, wherein a vertical dimension of the highly doped group III-N contact portion is at least 20 nm and at most 250 nm.

7. The semiconductor device according to claim 1, wherein the group III-N semiconductor layer is located on a group III-N buffer layer.

8. The semiconductor device according to claim 7, wherein the group III-N buffer layer has a thickness of at least 100 nm and of at most 8 µm.

9. The semiconductor device according to claim 1, wherein the metal contact structure comprises a sublayer comprising at least one of titanium, titanium nitride, and tantalum nitride.

10. The semiconductor device according to claim 9, wherein the sublayer of the metal contact structure has a thickness of at least 1 nm and of at most 20 nm.

11. The semiconductor device according to claim 1, wherein the metal contact structure comprises a metal portion comprising at least one of copper, tungsten and aluminum.

12. The semiconductor device according to claim 11, wherein the metal portion of the metal contact structure is located on the sublayer of the metal contact structure.

13. The semiconductor device according to claim 1, wherein the group III-N semiconductor layer is located on a silicon substrate.

14. The semiconductor device according to claim 1, wherein the metal contact structure is a source contact of a field effect transistor of the semiconductor device.

15. The semiconductor device according to claim 1, further comprising
   a further metal contact structure.

16. The semiconductor device according to claim 15, wherein the semiconductor device is configured to conduct a current between the metal contact structure and the further metal contact structure through the electrically insulating material layer and the group III-N semiconductor layer.

17. The semiconductor device according to claim 15, wherein the further metal contact structure is a drain contact of the field effect transistor of the semiconductor device.

18. The semiconductor device according to claim 17, wherein the field effect transistor of the semiconductor device further comprises a polarization layer located on the group III-N semiconductor layer and positioned laterally between the source contact and the drain contact of the field effect transistor.

19. The semiconductor device according to claim 1, wherein the metal contact structure provides an electrical contact to at least one of an anode region of a diode, a cathode region of a diode, a drain region of a transistor, a source region of a transistor, a collector region of a transistor, an emitter region of a transistor, and a base region of a transistor of the semiconductor device.

20. A semiconductor device comprising:
   a group III-N semiconductor layer; and
   a low resistive contact structure comprising a highly doped group III-N contact portion, an electrically insulating material layer and a metal contact structure,
   wherein the low resistive contact structure is located on the group III-N semiconductor layer,
   wherein the electrically insulating material layer is located on the highly doped group III-N contact portion, and the metal contact structure is located on the electrically insulating material layer,
   wherein the highly doped group III-N contact portion has a doping concentration of at least $1*10^{19}$ cm$^{-3}$.

21. The semiconductor device according to claim 20, wherein a thickness of the electrically insulating material layer is at least 0.3 nm and at most 2 nm.

22. A radio frequency device comprising:
   a field effect transistor; and
   a low resistive contact structure of the field effect transistor, wherein the low resistive contact structure comprises a highly doped group III-N contact portion, an electrically insulating material layer and a metal contact structure, wherein the metal contact structure provides a drain contact or a source contact of the field effect transistor, wherein the field effect transistor is configured to switch between an on state and an off state with a frequency of at least 1 GHz.

23. The radio frequency device according to claim 22, wherein a thickness of the electrically insulating material layer is at least 0.3 nm and at most 2 nm.

24. A method for forming a semiconductor device, the method comprising:

forming an electrically insulating material layer on a group III-N semiconductor layer; and forming a metal contact structure on the electrically insulating material layer;

wherein an electrical resistance between the metal contact structure and the group III N semiconductor layer through the electrically insulating material layer is smaller than $1*10^{-7}\Omega$ for an area of 1 mm$^2$.

25. The method according to claim 24, wherein the electrically insulating material layer has a thickness of at least 0.3 nm and at most 2 nm.

* * * * *